United States Patent [19]

Hashimoto

[11] 4,119,869

[45] Oct. 10, 1978

[54] CONSTANT CURRENT CIRCUIT

[75] Inventor: Masaru Hashimoto, Ayasemachi, Japan

[73] Assignee: Tokyo Shibaura Electric Company, Ltd., Japan

[21] Appl. No.: 763,675

[22] Filed: Jan. 28, 1977

[30] Foreign Application Priority Data

Feb. 26, 1976 [JP] Japan ............................ 51-21060[U]

[51] Int. Cl.2 ........................ H03K 17/00; H03F 3/04

[52] U.S. Cl. ........................... 307/296 R; 307/317 R; 330/297; 323/4

[58] Field of Search ....................... 307/296, 297, 290; 330/19, 22, 40; 323/4

[56] References Cited

U.S. PATENT DOCUMENTS

| | | | |
|---|---|---|---|
| 3,906,386 | 9/1975 | Hongu et al. | 330/22 |
| 3,935,478 | 1/1976 | Okada et al. | 307/296 |

*Primary Examiner*—Stanley D. Miller, Jr.
*Assistant Examiner*—B. P. Davis
*Attorney, Agent, or Firm*—Oblon, Fisher, Spivak, McClelland & Maier

[57] ABSTRACT

A constant current circuit including an emitter follower stage consisting of a transistor and a resistance connected in series thereto, an output stage connected in cascade with the emitter follower stage, and two diodes connected in series between the base of the transistor and an external power source, whereby a desired output current which flows through said output stage is obtained by supplying predetermined currents to the diodes and the emitter follower stage respectively.

2 Claims, 3 Drawing Figures

CONSTANT CURRENT CIRCUIT

BACKGROUND OF THE INVENTION

1. Field of the Invention

This invention relates to a constant current circuit and, more particularly to a constant current circuit for a semiconductor integrated circuit which can supply a relatively large current without enlargement of the chip size.

2. Description of the Prior Art

In semiconductor integrated circuits, diodes and transistors formed on the same pellet can be made with matching characteristics and therefore a constant current circuit in which the current is equal to or amounts to several times the bias current can easily be made. Now, in the known costant current circuit wherein a diode D for a bias stage is connected to the emitter of an output transistor Q, the emitter regions of the diode D and transistor Q are formed so that the ratio of those emitter areas is 1:N, for instance. In this case, the relationship of the constant current output $I_2$ flowing through the collector of the transistor Q to the bias current $I_1$ flowing through the diode D becomes $I_2/I_1 = N$, and in the case for which the value of N is close to 1 it is possible to obtain a constant current circuit with an extremely simple structure. If, however, the current consumption in the integrated circuit as a whole must be made small, for instance if a constant current output of 10 mA is to be obtained, then in order to make the bias current 1 mA, the emitter area of the transistor Q must be given a value which is 10 times that of the emitter area of the diode D, and therefore the chip size becomes large and this is therefore disadvantageous.

Also, if the aforesaid area ratio is made less than 10, for example, then the bias current is increased, and the current cnsumption in the integrated circuit as a whole increases and therefore this too is disadvantageous.

SUMMARY OF THE INVENTION

Accordingly, one object of this invention is to provide a constant current circuit for a semiconductor integrated circuit whose power consumption and chip size are small.

Another object of this invention is to provide a constant current circuit for a semiconductor integrated circuit whose bias current is small.

Yet another object of this invention is to provide a constant current circuit for a semiconductor integrated circuit suitable for a large constant current output.

A still further object of this invention is to provide an improved constant current circuit whose characteristics are independent of the temperature.

In accordance with the present invention, the foregoing and other objects are attained by the provision of a constant current circuit formed on a single semiconductor pellet which comprises an emitter follower stage having an input and an output and including a transistor and a resistance connected between the emitter of the transistor and an external power source, an output stage including a transistor whose base is connected to the output of the emitter follower stage and whose emitter is connected to the external power source, whereby its collector current becomes an output current, two diodes connected in series between the input of the emitter follower stage and the external power source and current power source means for supplying current to the diodes.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
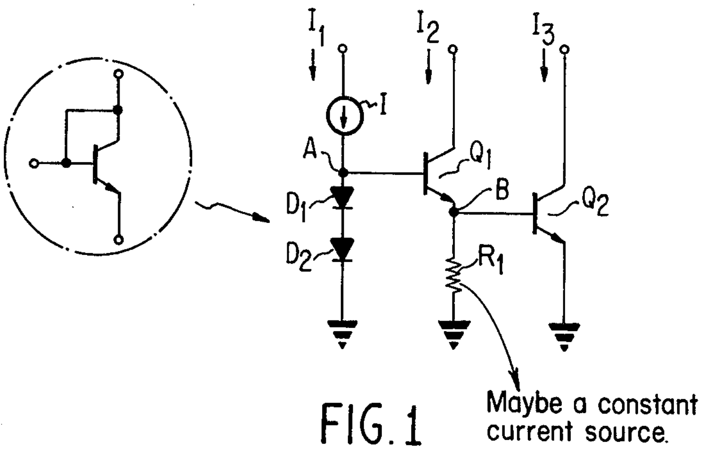
FIG. 1 is a schematic circuit diagram showing a constant current circuit according to one embodiment of this invention.

Referring now to the drawings, wherein like reference numerals designate identical or corresponding parts throughout and more particularly to FIG. 1 thereof, the constant current circuit according to one embodiment of this invention will now be described. Diodes $D_1$ and $D_2$ are diode - connected transistors, that is, the collector and base of an NPN transistor are connected and made the anode, and the emitter is made the cathode. The anode of diode $D_2$ is connected to the cathode of diode $D_1$, and the cathode of diode $D_2$ is grounded. A current source I for bias current is connected to the anode of diode $D_1$. This current source I may be a resistance connected to a voltage source. These diodes and an external voltage source form a bias stage. The base of an NPN transistor $Q_1$ is connected to the anode of diode $D_1$, the emitter of the transistor $Q_1$ is grounded through a resistance $R_1$, and the collector of the transistor $Q_2$ is connected to a power source (not shown in the drawing). Accordingly an emitter follower stage is formed by the transistor $Q_1$ and the resistance $R_1$. In this case, the input point A of the emitter follower stage is the base of transistor $Q_1$, and the output point B is the emitter of transistor $Q_1$. The base of the NPN transistor $Q_2$ is connected to the emitter of transistor $Q_1$ and the emitter of transistor $Q_2$ is grounded, and the collector current of transistor $Q_2$ becomes the output current. That is to say, $Q_2$ is the output transistor.

Next, an explanation of the relationship of the bias current $I_1$, collector current $I_2$ of transistor $Q_1$ and collector current $I_3$ of transistor $Q_2$ or output current will be made. In order to simplify the explanation, the emitter areas of transistors $Q_1$ and $Q_2$ and diodes $D_1$ and $D_2$ are taken equal by assuming that the influence of base currents of transistors $Q_1$ and $Q_2$ can be disregarded. The voltage $V_{BE}$ between the respective bases and emitters of $D_1$ and $D_2$ and of transistors $Q_1$ and $Q_2$ becomes $$V_{BE} = \frac{kT}{q}\, In \frac{Ic}{Is}$$

Here, K is Boltzmann's constant, T is the absolute temperature, q is the quantity of electricity of an electron, $I_c$ is the collector current and $I_s$ is the saturation current. Since diodes $D_1$ and $D_2$, and transistors $Q_1$ and $Q_2$ are formed in the same pellet, the values of $I_s$ are equal, and also KT/q can be regarded a constant, and therefore the base-emitter voltage $V_{BE}$ of transistor $Q_2$ is given by the following equation (by subtracting the potential at point B from the potential at point A)

$$V_{BE2} = \frac{kT}{q} (2ln \frac{I_1}{I_s} - ln \frac{I_2}{I_s}) = \frac{kT}{q} ln \frac{I_1^2}{I_s I_2}$$

also $$V_{BE2} = \frac{kT}{q} ln \frac{I_3}{I_s}$$

and therefore the relationship between $I_1$, $I_2$ and $I_3$ is $$\frac{kT}{q} ln \frac{I_3}{I_s} = \frac{kT}{q} ln \frac{I_1^2}{I_s I_2}$$

and accordingly $$I_1^2 = I_2 I_3 \quad (1)$$

Accordingly, in order to set the ratio of $I_1$ to $I_3$ as 1:N, for example, the value of $I_2$ may be made I/N of $I_1$, and therefore a constant current output is obtained without making the emitter area large. Furthermore, the output current is independent of the temperature as shown in equation (1). Also, while for the purpose of the description the emitter areas of all the transistors and all the diodes have been made equal, even if the size of the emitter areas of the various elements are different this merely results in insertion of a constant in the foregoing equation. Therefore, if the ratio of the areas of the emitter regions is not too large, this invention is practiced just as when the emitter areas are equal. Likewise, an output current $I_3$ smaller than the bias current $I_1$ can be obtained by making a large current $I_2$ flow through the emitter follower stage.

Figure 2:
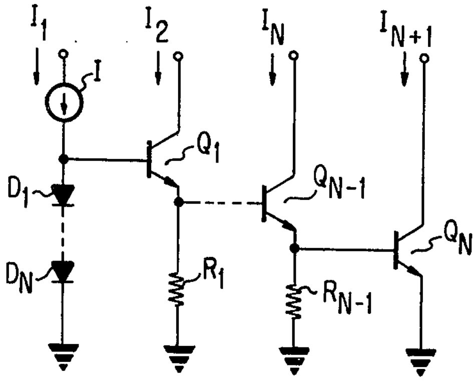
FIGS. 2 and 3 are schematic circuit diagrams showing constant current circuits according to other embodiments of this invention.

Referring now to FIG. 2, a modified constant current circuit according to this invention is illustrated, in which there are (N-1) emitter follower stages $Q_1$ to $Q_{N-1}$: the NPN transistor QN is the output transistor, and the number of diodes, $D_1$ to $D_N$, is equal to the number of transistors, $Q_1$ to $Q_{N-1}$, and $Q_N$. The input point of the emitter follower stages is the base of transistor $Q_1$, and their output point is the emitter of transistor $Q_{N-1}$. By means of an arrangement of this kind a large output current, $I_{N+1}$, can be obtained with a small bias current $I_1$.

Figure 3:
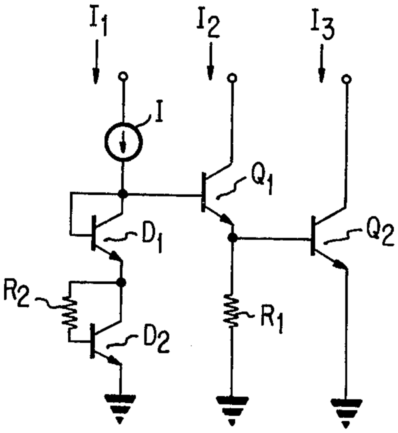

Referring to FIG. 3, a further modified constant current circuit according to this invention is illustrated. A resistance $R_2$ is connected between collector and the base of diode $D_2$. Ordinarily, the base current of the output transistor $Q_2$ influences the emitter current $I_e$ of the transistor of former stage. According to this embodiment, it is possible to minimize the influence. A resistance may be formed in the diode $D_1$, as well.

Also, in FIGS. 1 to 3, the NPN transistors may be replaced by PNP transistors. In this case, the diodes must be connected with reversed polarity. Accordingly, the direction of current flow is reversed.

Further, the resistance in the emitter follower stage can be a direct current resistance device such as a constant current source.

As set forth above, when the present invention is used in a constant current circuit for a semiconductor integrated circuit it is possible to obtain a large output current with a small bias current, and also the required semiconductor chip size can be made small.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A constant current circuit formed on a single semiconductor pellet and comprising:

an emitter following stage having an input and an output, the emitter follower stage including a first transistor having its base connected to the input, a first resistor, and means for connecting the first resistor between the emitter of the first transistor and an external reference potential;

an output stage including a second transistor havings its base connected to the emitter of the emitter follower stage, and means for connecting the emitter of the second transistor to the external reference potential, whereby the collector current of the second transistor becomes an output current;

a diode connected to the input of the emitter follower stage;

a third transistor;

a second resistor connected between the base and the collector of the third transistor;

means for connecting the third transistor between the diode and the external reference potential; and current power source means for supplying current to the diode.

2. The constant current circuit recited in claim 1 wherein the first resistor is a constant current source.

* * * * *